US008222163B2

(12) United States Patent
Lay et al.

(10) Patent No.: US 8,222,163 B2
(45) Date of Patent: Jul. 17, 2012

(54) METHOD OF FLATTENING A RECESS IN A SUBSTRATE AND FABRICATING A SEMICONDUCTOR STRUCTURE

(75) Inventors: Chao-Wen Lay, Miaoli County (TW); Ching-Kai Lin, Boise, ID (US)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 5 days.

(21) Appl. No.: 12/851,561

(22) Filed: Aug. 6, 2010

(65) Prior Publication Data

US 2012/0034791 A1 Feb. 9, 2012

(51) Int. Cl.
*H01L 21/31* (2006.01)
*H01L 21/469* (2006.01)

(52) U.S. Cl. ............... 438/770; 257/E21.282
(58) Field of Classification Search ............ 438/770; 257/E21.282
See application file for complete search history.

(56) References Cited

U.S. PATENT DOCUMENTS

| 5,371,036 A * | 12/1994 | Lur et al. ............ 438/445 |
| 5,465,003 A * | 11/1995 | Lur et al. ............ 257/510 |
| 5,942,780 A * | 8/1999 | Barsan et al. ........ 257/321 |
| 6,074,931 A * | 6/2000 | Chang et al. ......... 438/424 |
| 6,081,662 A * | 6/2000 | Murakami et al. ..... 703/14 |
| 6,555,484 B1 * | 4/2003 | Ramkumar et al. .... 438/766 |
| 2007/0026632 A1 * | 2/2007 | Yamamoto ........... 438/424 |
| 2009/0001048 A1 * | 1/2009 | Yoon et al. .......... 216/27 |
| 2011/0316601 A1 * | 12/2011 | Chang et al. ........ 327/161 |

* cited by examiner

*Primary Examiner* — Alexander Ghyka
*Assistant Examiner* — Stanetta Isaac
(74) *Attorney, Agent, or Firm* — Winston Hsu; Scott Margo

(57) ABSTRACT

A recess is usually formed on the sidewall of the trench due to the dry etch. The recess may influence the profile of an element formed in the trench. Therefore, a method of flattening a recess in a substrate is provided. The method includes: first, providing a substrate having a trench therein, wherein the trench has a sidewall comprising a recessed section and an unrecessed section. Then, a recessed section oxidation rate change step is performed to change an oxidation rate of the recessed section. Later, an oxidizing process is performed to the substrate so as to form a first oxide layer on the recessed section, and a second oxide layer on the unrecessed section, wherein the second oxide layer is thicker than the first oxide layer. Finally, the first oxide layer and the second oxide layer are removed to form a flattened sidewall of the trench.

17 Claims, 4 Drawing Sheets

METHOD OF FLATTENING A RECESS IN A SUBSTRATE AND FABRICATING A SEMICONDUCTOR STRUCTURE

BACKGROUND OF THE INVENTION

1. Field of the Invention

The present invention relates to a method of flattening a recess in a substrate, and more particularly to a method of flattening a recess on the sidewall of a trench in the substrate.

2. Description of the Prior Art

Capacitors are one type of component commonly used in the fabrication of integrated circuits, for example in DRAM circuitry. As integrated circuitry density has increased, there is a continuing challenge to maintain sufficiently high storage capacitance despite the decreasing capacitor area.

One technique used to improve the storage capacitance for the higher density DRAM cells is a stack capacitor. The capacitor structure of a stack capacitor is formed over the gate electrode of the transistor, rather than being in the same spatial plane as the gate electrode. To form the stack capacitor, a trench is formed in a sacrifice layer. The trench is then filled with a bottom electrode, a dielectric layer, and a top electrode. After that, the sacrifice layer is removed to form the stack capacitor.

Another technique proposed to improve the storage capacitance for higher density DRAM cells is a trench capacitor. The capacitor structure of a trench capacitor is formed within a trench.

For both the stack capacitor and the trench capacitor, greater capacitor surface area correlates to the trench design that is spatially deeper or wider. The trench width can not be enlarged due to the limited amount of substrate surface area for each memory cell. Thus, the depth of the trench must be increased by fabrication of the deeper trench. This deeper trench has high aspect ratio.

Moreover, besides the trenches in the capacitors, lots of elements also need trenches in their structures in integrated circuits. The trenches in those elements also have high aspect ratio in order to reach high density of the integrated circuits.

However, such high aspect ratio trenches usually have defects on their surfaces. For example, recesses on the sidewall of the trenches. Therefore, the performance of those elements may be deteriorated due to these defects.

SUMMARY OF THE INVENTION

Therefore, it is one object of the present invention to provide a fabricating method to flatten a recess on the substrate, and to form a uniform sidewall of a trench.

According to an embodiment of the present invention, a method of flattening a recess in a substrate includes: providing a substrate having a surface comprising a recessed section and an unrecessed section. Then, an oxidation rate change step is performed to change an oxidation rate of the recessed section. Later, oxide layers of different thickness are formed by oxidizing the surface of the substrate. Finally, the oxide layers are removed to form a conformal flattened surface on the substrate.

According to another embodiment of the present invention, a method of fabricating a semiconductor structure includes: providing a substrate having a trench therein, wherein the trench has a sidewall comprising a recessed section and an unrecessed section. Then, an oxidation rate change step is performed to make the oxidation rate of the recessed section different from that of the unrecessed section. After that, an oxidizing process is performed to the substrate so as to form oxide layers. Finally, the oxide layers are removing to form a conformal flattened sidewall of the trench.

This method can be especially applied to the numerous trenches disposed adjacent to each other in the substrate, and each trench has at least one recessed section. The recessed section makes the distance between two adjacent trenches hard to control. The method provided in the present invention can flatten the recessed sections, and to form consistent distance between two adjacent trenches.

These and other objectives of the present invention will no doubt become obvious to those of ordinary skill in the art after reading the following detailed description of the preferred embodiment that is illustrated in the various figures and drawings.

DETAILED DESCRIPTION

In the fabrication of integrated circuits, trenches are often formed in order to embed circuit elements inside a substrate. For example, both stack and trench capacitors need trenches in fabricating capacitor structures. A shallow trench isolation (STI) process or the fabrication of recessed transistors also starts with the fabrication of trenches. During the formation of the trenches, a defective recess may be formed on the vertically sidewall of the trenches. The claimed invention addresses this problem. The present invention method can be applied to any situation where there is a recess on the substrate to be flattened.

FIG. 1 to FIG. 5 depict a method of flattening a recess in a substrate schematically.

Figure 1:
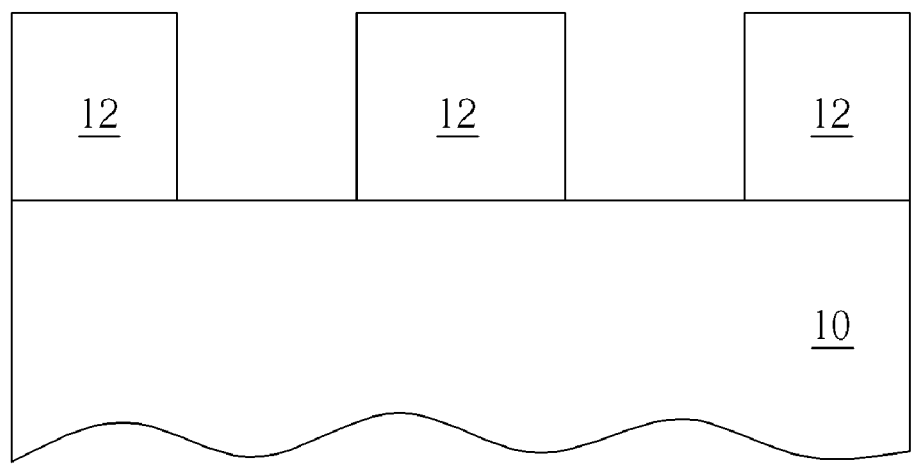
FIG. 1 to FIG. 5 depict a method of flattening a recess in a substrate schematically in accordance with one embodiment of this invention.
Figure 2:
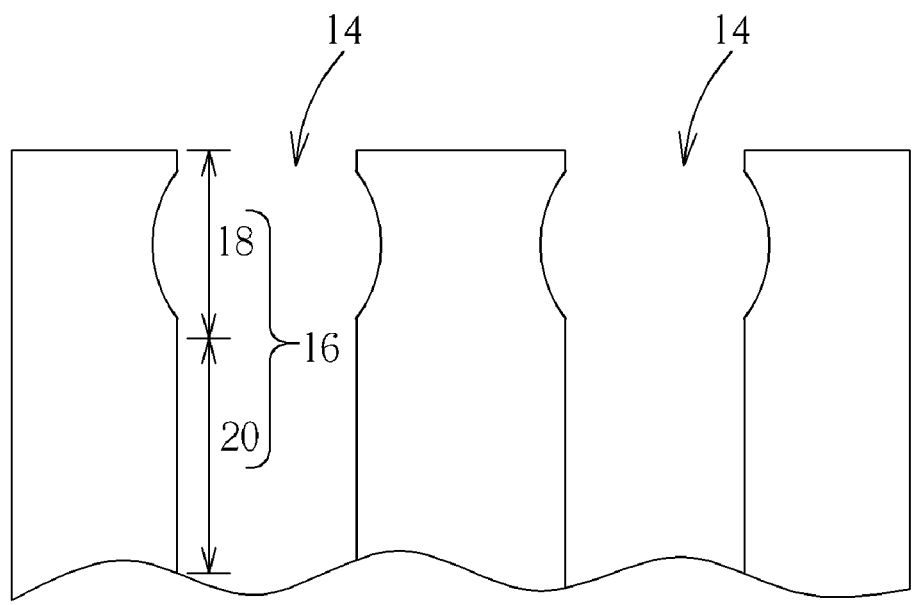

As shown in FIG. 1, a substrate 10 covered with a patterned mask 12 is provided. The substrate 10 may be a silicon substrate. As shown in FIG. 2, using the patterned mask 12 as a hard mask, a dry etch process is performed to form a trench 14 in the substrate 10. Later, the patterned mask 12 is removed. The trench 14 in the substrate 10 includes a vertical sidewall 16 with a recessed section 18 and an unrecessed section 20. Due to the characteristic of the dry etch process, the recessed section 18 may include a cambered surface.

Figure 3:
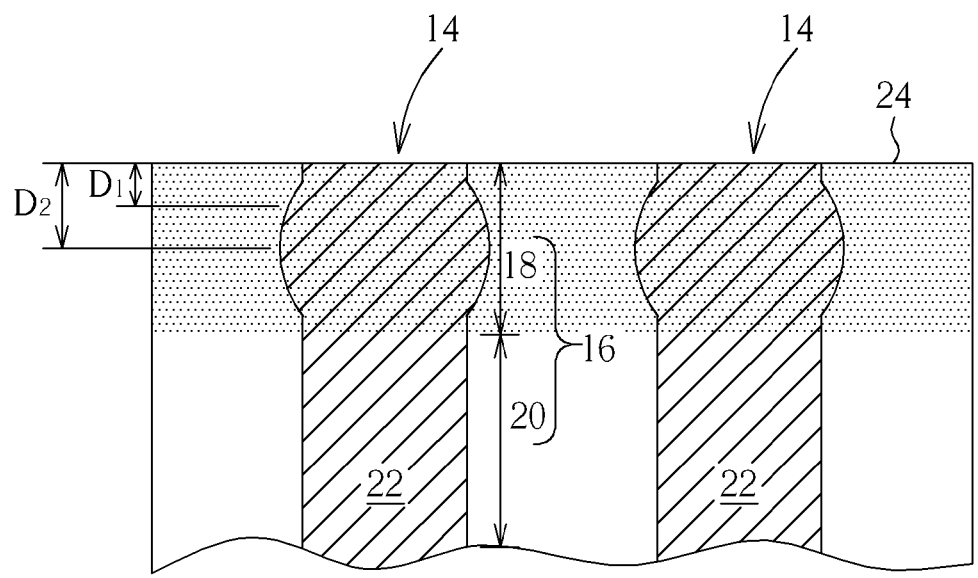

As shown in FIG. 3, a sacrifice layer 22 fills up the trench 14. Then, an oxidation rate change step such as an implantation process is performed to change an oxidation rate of the recessed section 18 and make the oxidation rate of the recessed section different from that of the unrecessed section. The implantation process is performed by implanting dopants (shown by dots) into the recessed section 18. More specifically, the dopants are implanted into the substrate 10 from the main surface 24 of the substrate 10 to a predetermined depth. The dopants can be P-type dopants or N-type dopants. Preferably, the dopants are N-type. According to a preferred embodiment, a dopant concentration in the recessed section 18 can be relative to the depth of the recessed section 15. For example, as shown in FIG. 3, a part of the recessed section 18 with depth $D_1$ has higher dopant concentration, and a part of the of the recessed section 18 with depth $D_2$ has lower dopant concentration.

During the implantation process, the sacrifice layer 22 can keep the unrecessed section 20 of the trench 14 from being hit by the dopants. The sacrifice layer 22 may be photoresist, silicon carbon or other suitable materials.

Figure 4:
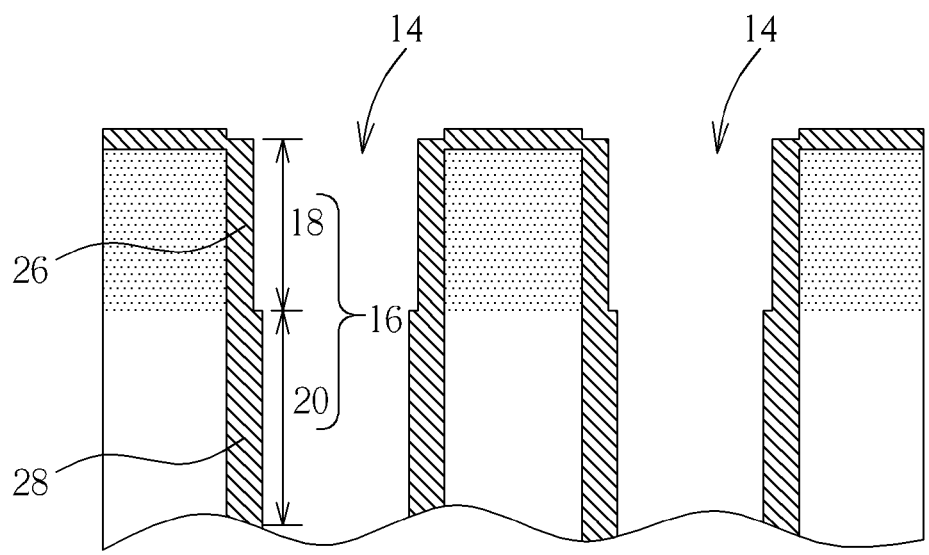

As shown in FIG. 4, the substrate 10 is oxidized in a forming gas, and the sacrifice layer 22 is striped off in the forming gas as well. It is note worthy that the oxidation rate of the substrate 10 is relative to the dopant concentration in the substrate 10. The higher dopant concentration is, the slower the oxidation rate becomes. Therefore, the oxidation rate of the recessed section 18 is smaller than that of the unrecessed section 20 because the recessed section 18 is implanted with dopants. Consequently, after applying the forming gas, two oxide layers of different thicknesses such as a first oxide layer 26, and a second oxide layer 28 are formed on the recessed section 18 and on the unrecessed section 20, respectively. Based on the difference between the oxidation rate of the recessed section 18 and the oxidation rate of the unrecessed section 20, the second oxide layer 28 has a thickness thicker than a thickness of the first oxide layer 26. The first oxide layer 26 and the second oxide layer 28 may be both silicon oxide. If the dopant concentration in the recessed section 18 correlates to the depth of the recessed section 18, the thickness of the first oxide layer 26 may be non-uniformed.

Figure 5:
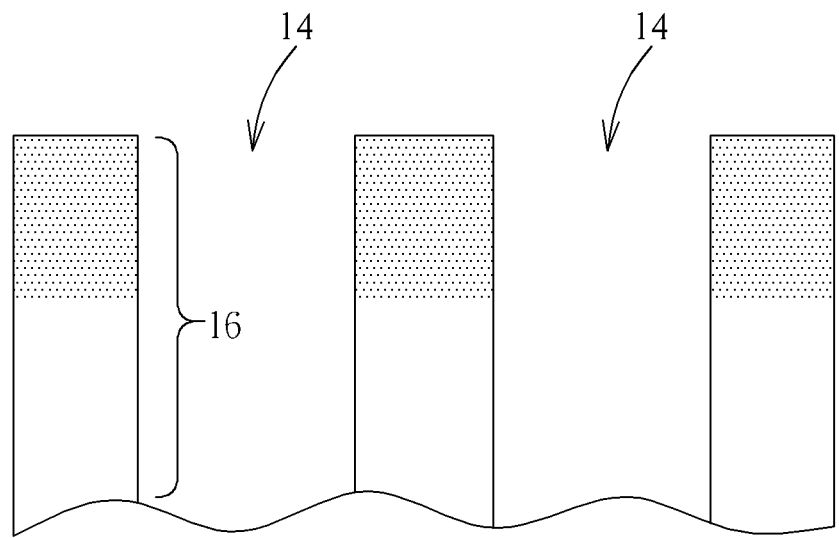

As shown in FIG. 5, the first oxide layer 26 and the second oxide layer 28 are removed. For example, by a wet etch process. At this point, the vertical sidewall 16 of the trench 14 becomes a conformal flattened surface, and the recess is removed.

After flattening the recess on the trench, a semiconductive device such as a capacitor, a STI, or a recessed transistor can be fabricated inside the trench. For example, to form a capacitor, a bottom electrode is deposited conformally on the sidewall and bottom wall of the trench. Then, a capacitor dielectric layer is formed on the bottom electrode. After that, a top electrode is formed on the capacitor dielectric layer. Later, a planarization is performed to align the top surface of the bottom electrode, the capacitor dielectric layer, and the top electrode to the main surface of the substrate. Subsequently, the substrate is removed, and a stack capacitor is formed.

Figure 6:
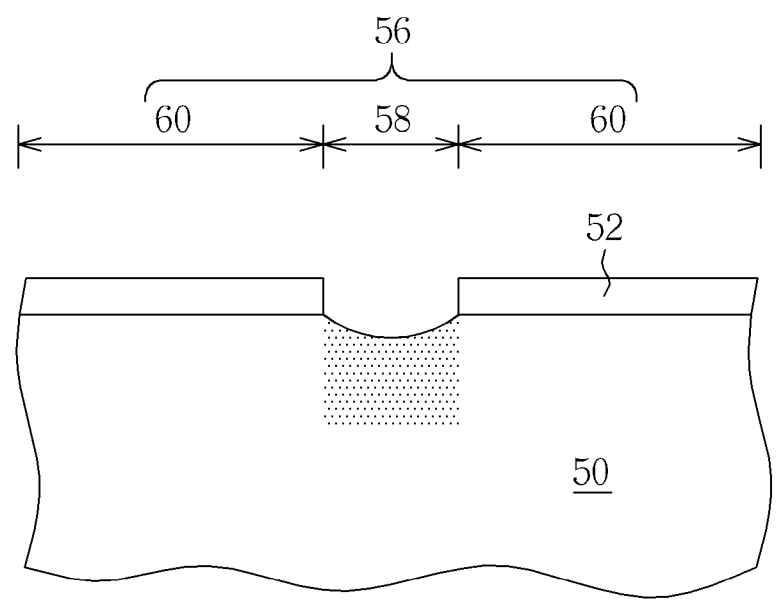
FIG. 6 to FIG. 8 depict a method of flattening a recess in a substrate schematically in accordance with another embodiment of this invention.
Figure 7:
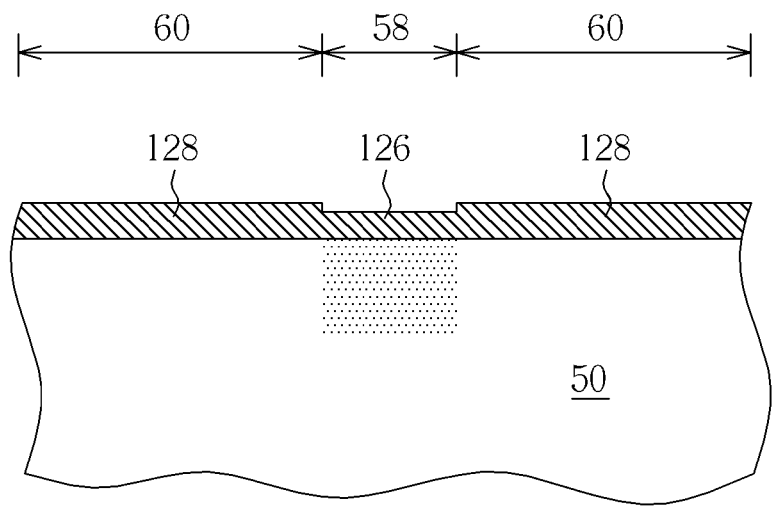
Figure 8:
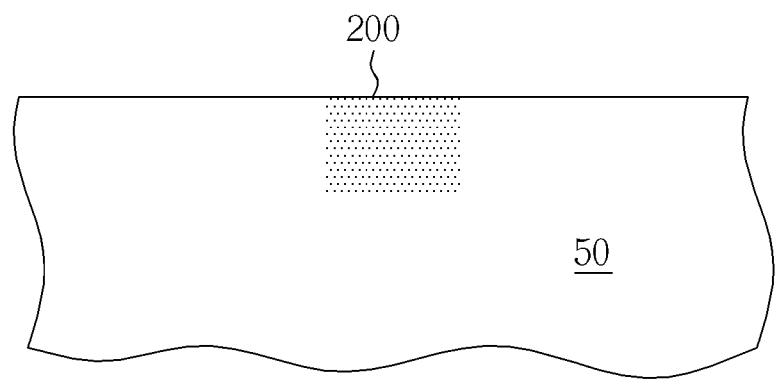

According to another preferred embodiment, the method of flattening a recess in the present invention can be apply to a substrate with a recess in its horizontal surface as well. FIG. 6 to FIG. 8 depict a method of flattening a recess in a substrate according to another preferred embodiment of the present invention. As shown in FIG. 6, a substrate 50 has a horizontal surface 56 including a recessed section 58 and an unrecessed section 60 on it. The recessed section 58 can be removed by the aforesaid oxidation rate change step. For example, the oxidation rate change step can be performed by implanting dopants (shown by dots) into the recessed section 58 by using a patterned mask 52 as a mask. Then, an oxidation process is performed to grow a first oxide layer 126 on the recessed section 58 and a second oxide layer 128 on the unrecessed section 60. Later, the oxide layers 126, 128 are removed to form a conformal flattened surface 200.

One of the distinct features of the present invention is that the oxidation rate of the substrate is changed by implanting dopants. The implanted dopants make the substrate have different oxidation rates in different sections. The recessed section is implanted with higher dopant concentration than the unrecessed section. Therefore, after the oxidation process, the oxide layers within the recessed section and within the unrecessed section have different thicknesses. Thereafter, the oxide layers are removed, and the surface of the substrate becomes flat.

Those skilled in the art will readily observe that numerous modifications and alterations of the device and method may be made while retaining the teachings of the invention.

What is claimed is:

1. A method of flattening a recess in a substrate, comprising the steps of:
   providing a substrate having a surface with a recessed section and a unrecessed section;
   changing an oxidation rate of the recessed section by implanting dopants into the recessed section to make the oxidation rate of the recessed section different from that of the unrecessed section;
   forming a first oxide layer in the recessed section and a second oxide layer in the unrecessed section, wherein the first oxide layer and the second oxide layer have different thicknesses; and
   removing the first oxide layer and the second oxide layer to form a conformal flattened surface of the substrate.

2. The method of flattening a recess in a substrate of claim 1, wherein the recessed section is a cambered surface.

3. The method of flattening a recess in a substrate of claim 1, wherein a dopant concentration in the recessed section relates to a depth of the recessed section.

4. The method of flattening a recess in a substrate of claim 1, wherein after the recessed section oxidation rate change step, the oxidation rate of the recessed section becomes smaller than that of the unrecessed section.

5. The method of flattening a recess in a substrate of claim 1, wherein the substrate comprises silicon.

6. The method of flattening a recess in a substrate of claim 1, the dopants are only implanting into the recessed section.

7. The method of fabricating a semiconductor structure of claim 1, wherein the thickness of the first oxide layer is smaller than the thickness of the second oxide layer.

8. A method of fabricating a semiconductor structure, comprising the steps of:
   providing a substrate having a trench therein, wherein the trench has a sidewall comprising a recessed section and a unrecessed section;
   changing an oxidation rate of the recessed section by implanting dopants into the recessed section to make the oxidation rate of the recessed section different from that of the unrecessed section;
   forming a first oxide layer in the recessed section and a second oxide layer in the unrecessed section, wherein the first oxide layer and the second oxide layer have different thicknesses; and
   removing the first oxide layer and the second oxide layer to form a conformal flattened sidewall.

9. The method of fabricating a semiconductor structure of claim 8, further comprising filling the trench with a sacrifice layer before the recessed section oxidation rate change step, and the recessed section oxidation rate change step is performed in the presence of the sacrifice layer.

10. The method of fabricating a semiconductor structure of claim 9, wherein the sacrifice layer is removed when forming the first oxide layer and the second oxide layer.

11. The method of fabricating a semiconductor structure of claim 9, wherein the sacrifice layer comprises photoresist or silicon carbon.

12. The method of fabricating a semiconductor structure of claim 8, wherein the recessed section is a cambered surface.

13. The method of fabricating a semiconductor structure of claim 8, wherein the dopant concentration in the recessed section relates to a depth of the recessed section.

14. The method of fabricating a semiconductor structure of claim 8, wherein the oxidation rate of the recessed section becomes smaller than that of the unrecessed section after the recessed section oxidation rate change step.

15. The method of fabricating a semiconductor structure of claim 8, wherein the substrate comprises silicon.

16. The method of fabricating a semiconductor structure of claim 8, the dopants are only implanting into the recessed section of the trench.

17. The method of fabricating a semiconductor structure of claim 8, wherein the thickness of the first oxide layer is smaller than the thickness of the second oxide layer.

* * * * *